United States Patent [19]
Chang

[11] Patent Number: 5,408,115
[45] Date of Patent: Apr. 18, 1995

[54] SELF-ALIGNED, SPLIT-GATE EEPROM DEVICE

[75] Inventor: Kuo-Tung Chang, Austin, Tex.

[73] Assignee: Motorola Inc., Schaumburg, Ill.

[21] Appl. No.: 223,395

[22] Filed: Apr. 4, 1994

[51] Int. Cl.$^6$ .......................................... H01L 27/12
[52] U.S. Cl. ..................... 257/324; 257/314; 257/326; 257/637; 257/640; 257/900
[58] Field of Search ............... 257/314, 324, 326, 637, 257/640, 900

[56] References Cited

U.S. PATENT DOCUMENTS

| | | | |
|---|---|---|---|
| 5,020,030 | 5/1991 | Huber | 365/185 |
| 5,051,793 | 9/1991 | Wang | 357/23.5 |
| 5,063,172 | 11/1991 | Manley | 437/43 |
| 5,130,769 | 7/1992 | Kuo et al. | 357/23.5 |
| 5,225,362 | 7/1993 | Bergemont | 437/43 |
| 5,274,588 | 12/1993 | Manzur et al. | 257/316 |
| 5,280,446 | 1/1994 | Ma et al. | 365/185 |

OTHER PUBLICATIONS

T. Y. Chen et al., "A True Single-Transistor Oxide-Nitride-Oxide EEPROM Device", IEEE EDL-8, No. 3, Mar. 1987, pp. 93–95.
A. T. Wu et al., "A Novel High Speed 5-Volt Programming EPROM Structure with Source-Side Injection", IEDM 1986, pp. 584–587.
K. Naruke, et al., "A New Flash-Erase EEPROM Cell with a Sidewall Select-Gate on its Source Side", IEDM 1989, pp. 603–606.
Y. Yamauchi, et al., "A 5V-only Virtual Ground Flash Cell with an Auxiliary Gate for High Density and High Speed Application", IEDM 1991, pp. 319–322. Jan.

Primary Examiner—Edward Wojciechowicz
Attorney, Agent, or Firm—Jasper W. Dockrey

[57] ABSTRACT

An EEPROM device capable of operating with a single low-voltage power supply includes a control gate electrode (30) and a select gate electrode (14) overlying separate portions of a channel region (32). Electrical charge is stored in an ONO layer (20) overlying a portion of the channel region (32) and separating the control gate electrode (30) from the channel region (32). The memory device is programmed using source-side injection, where electrons traverse the channel region (32) and are injected into trapping sites (34) located within the silicon nitride layer (24) of the ONO layer (20). To provide the necessary field gradient within the channel region (32), the control gate electrode (30) is spaced apart from the source region (16) by the select gate electrode (14). In either of two embodiments, two layers of polysilicon are used to form the select gate electrode (14) and the control gate electrode (30). The second layer of polysilicon is formed as a sidewall spacer on the first layer of polysilicon. Accordingly, a high-density memory device is achieved.

13 Claims, 2 Drawing Sheets

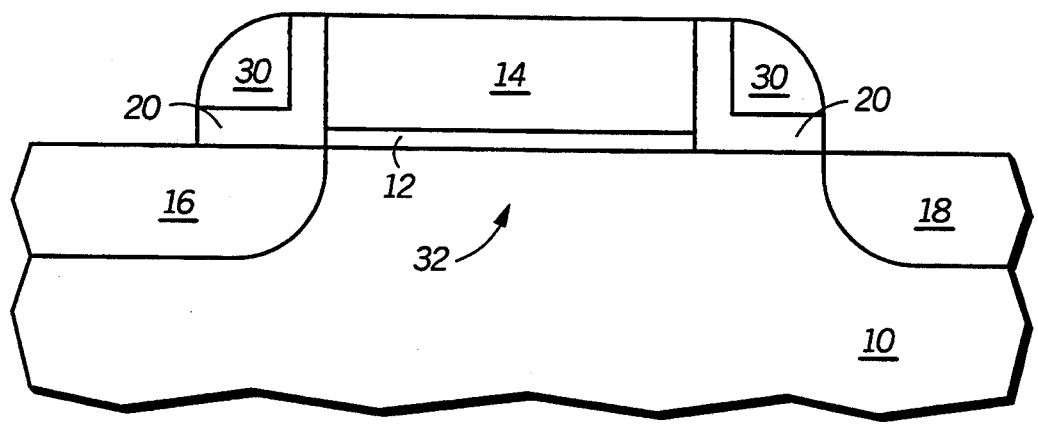
*FIG.1-a*
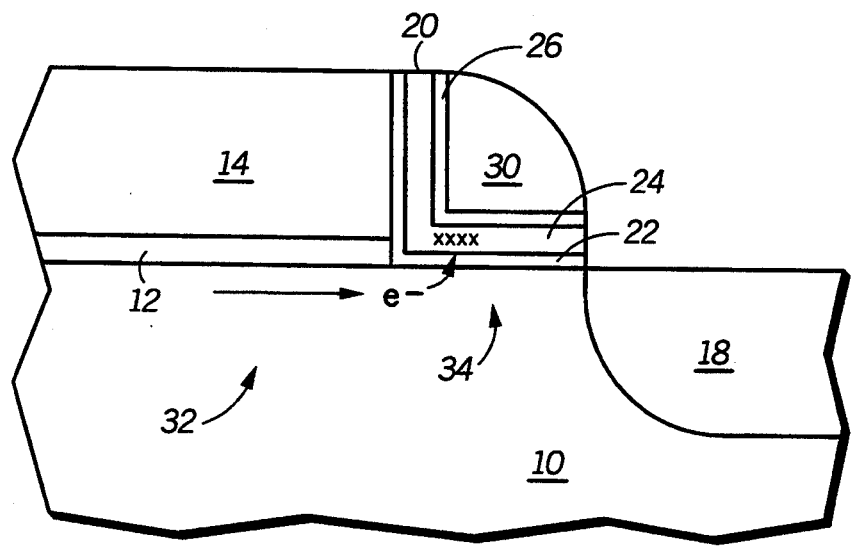
*FIG.1-b*
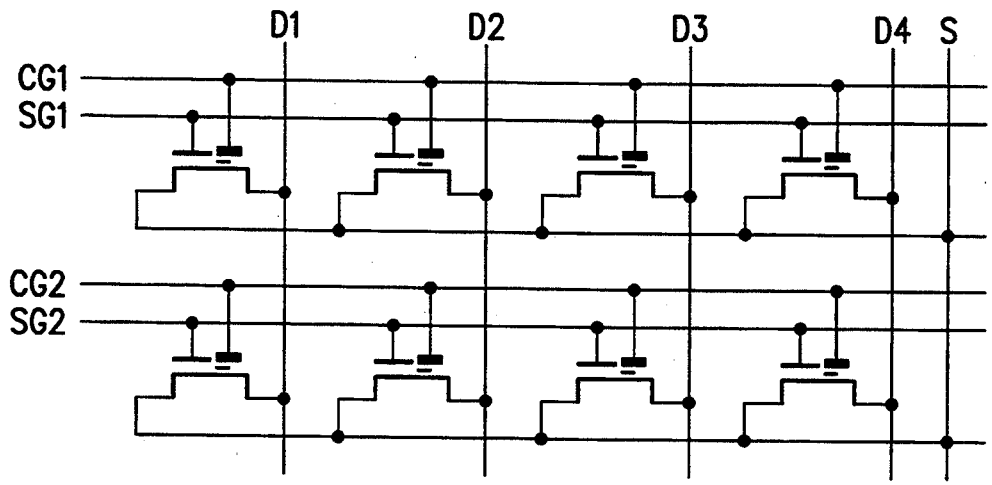
*FIG.2*

SELF-ALIGNED, SPLIT-GATE EEPROM DEVICE

FIELD OF THE INVENTION

This invention relates in general to non-volatile memory devices, and more particularly to split-gate, non-volatile memory devices capable of operating at low power supply voltages, and further, to methods for operating and fabricating such devices.

BACKGROUND OF THE INVENTION

State of the art non-volatile memory devices are typically constructed by fabricating a field effect transistor in a silicon substrate. The field effect transistor is capable of storing electrical charge either in a separate gate electrode, known as a floating gate, or in a dielectric layer underlying a control gate electrode. Data is stored in a non-volatile memory device by changing the threshold voltage of the field effect transistor through the storage of electrical charge over the channel region of the substrate. For example, in an n-channel enhancement device, an accumulation of electrons in a floating gate electrode, or in a dielectric layer overlying the channel region, creates a high threshold voltage in the field effect transistor. When the control gate is grounded, current will not flow through the transistor, which is defined as a logic 0 state. Conversely, a reduction in the negative charge over the channel region creates a low threshold voltage, possibly negative. In this condition, with the control gate grounded, current will flow through the field effect transistor, which is defined as a logic 1 state.

One particular type of non-volatile memory device is the flash EEPROM (electrically-erasable-programmable-read-only-memory). Flash EEPROMs are a type of device which provide electrical erasing capability. The term "flash" refers to the ability to erase the memory cells simultaneously with electrical pulses. In an erased state, the threshold voltage of the field effect transistor is low and electrical current can flow through the transistor indicating a logic 1 state.

To program an EEPROM cell, typically, drain-side hot-electron injection is used to inject electrons onto either a floating gate electrode, or into trapping sites in a dielectric film overlying the channel region. The injection current can be enhanced by increasing either the channel electric field, or the electric field in the dielectric layer. To reduce the amount of time necessary to complete a programming operation, very high drain and gate voltages are used, such that the transistor is operating very close to breakdown during programming. However, the high voltages necessary for drain-side injection require that an additional power supply be provided to supply voltage levels in excess of the standard 5-volt operating voltage.

Breakdown conditions during programming can be avoided by injecting electrons from the source region, rather than the drain region. To program an EEPROM device using source-side injection, a select gate electrode is formed overlying a portion of the channel region adjacent to the source region. The select gate electrode is electrically isolated from the control gate electrode, which is formed adjacent to the drain region. During programming, an electric field gradient is established in the channel region such that electrons originating in the source region are accelerated across a potential drop, and are injected onto a floating gate electrode located below the control gate electrode. Programming with source side injection increases the longevity of an EEPROM device by reducing the stress on the dielectric layer as compared with the excessive electric fields used for drain-side injection. Additionally, it has been demonstrated that source-side injection can be many times more efficient than drain side injection. The higher efficiency reduces the amount of time necessary to perform a programming operation.

Although EEPROM devices using source-side injection offer enhanced programming ability and extended operating life, the construction of an EEPROM memory cell using source-side injection typically requires that three separate semiconductor layers be provided for the fabrication of a select gate, a control gate, and a floating gate. The necessity of providing three separate polysilicon layers for the fabrication of gate electrodes vastly increases the complexity of the fabrication process. Additionally, the necessity of placing three separate electrodes over the channel region increases the cell size of the EEPROM device. Accordingly, further advances in device design and fabrication are necessary to meet the demand for high-density EEPROM memory arrays.

SUMMARY OF THE INVENTION

In practicing the present invention there is provided a self-aligned, split-gate EEPROM device, which can be operated using a single 5-volt power supply. The memory device fabricated in accordance with the invention, is programmed by injecting electrons from the source region of the device into trapping sites located within an ONO layer. The memory device is erased by Fowler-Nordheim tunneling of electrons through the top oxide of the ONO layer. Superior data retention is achieved through the use of a relatively thick bottom oxide layer in the ONO composite layer. Additionally, a split-gate EEPROM device using source-side is provided by the deposition and etching of only two layers of semiconductor material.

In one embodiment of the invention, a semiconductor substrate is provided having a source region and a drain region therein. The source and drain regions are spaced apart by a channel region, and a select gate electrode overlies a first portion of the channel region, and is separated from the channel region by a dielectric layer. A control gate electrode overlies a second portion of the channel region, and is spaced apart from the source region by the select gate electrode. An ONO layer separates the control gate electrode from the channel region. The ONO layer includes a relatively thick silicon dioxide layer overlying the substrate and is separated from a relatively thin silicon dioxide layer by a silicon nitride layer.

By fabricating the select gate electrode over a portion of the channel region adjacent to the source region, a potential gradient can be created in the channel region to impart sufficient energy to electrons to propel them across the potential barrier created by the relatively thick silicon oxide layer, and into the trapping sites in the silicon nitride layer. The operational characteristics of the non-volatile memory device of the invention permit the device to be operated by low voltage power supplies, and in particular, a charge pumped, 3-volt power supply can be used to operate the memory device of the invention.

BRIEF DESCRIPTION OF THE DRAWINGS

FIGS. 1-*a* and 1-*b*, illustrate, in cross-section, an EEPROM device fabricated in accordance with one embodiment of the invention;

FIG. 2 is a schematic diagram of a memory cell array incorporating the EEPROM device of the present invention;

Figure 3:
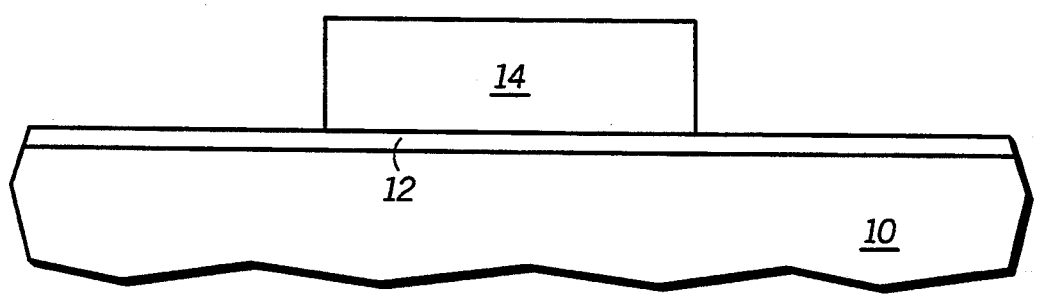
FIGS. 3-5 illustrate, in cross-section, exemplary process steps for the fabrication of an EEPROM device in accordance with one embodiment of the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides and EEPROM device which is capable of being programmed and erased by using a single power supply. Additionally, the EEPROM device of the invention incorporates sidewall spacer fabrication techniques to achieve a high-density non-volatile memory cell having a split-gate configuration. High programming efficiency is attained by storing electrons in trapping sites within a silicon nitride layer located between a control gate and the channel region of an n-type transistor formed in a silicon substrate. The programming current is regulated by a select gate electrode which overlies the channel region and provides a programming current of about 10 to 15 microamps. Superior data retention is achieved in the EEPROM device of the invention through the use of a relatively thick silicon oxide layer situated between the silicon nitride layer and the substrate channel region. The novel arrangement of the control gate and the select gate of the EEPROM device, in association with charge storage in a silicon nitride layer, yields a highly compact EEPROM device configuration. The EEPROM device of the invention can be easily integrated into memory cell arrays in non-volatile memory devices, and in complex integrated circuits, such as microprocessor and microcontroller devices, and the like.

An EEPROM device arranged in accordance with one embodiment of the invention is illustrated in cross-section, in FIG. 1-*a*. The EEPROM device is formed in a portion of a semiconductor substrate 10, in which a source region 16 and a drain region 18 reside and define a channel region 32 therebetween. A select gate electrode 14 is formed over a first portion of the channel region and is separated from the first portion of the channel region by a dielectric layer 12. A control gate electrode 30 is formed as a sidewall spacer overlying an edge portion of select gate electrode 14 and a second portion of channel region 32. Control gate electrode 30 is separated from both select gate electrode 14 and channel region 32 by an ONO layer 20. Although control gate electrode 30 is shown overlying two sides of select gate 14, the portion of control gate 30 overlying source region 16 does not participate in the memory function of the EEPROM device. Accordingly, the source-side portion of control gate 30 can be either removed or grounded depending upon the requirements of the integrated circuit in which the EPROM device is to be used.

In the following description, the EEPROM device illustrated in FIG. 1-*a* will be described in the context of the structure and function of an n-channel EEPROM cell and array. Accordingly, semiconductor substrate 10 is predominantly of p-type conductivity with n-type regions therein forming the source and drain regions. Those skilled in the art will recognize that while this is, by far, the most common choice for EEPROM devices, it is also possible to reverse the conductivity and fabricate a p-channel EEPROM array.

The method of programming the EEPROM device of the present invention is illustrated in FIG. 1-*b*, where an exploded view of a portion of the device shown in FIG. 1-*a* is illustrated. ONO layer 20 is comprised of a first silicon oxide layer 22 overlying the surface of channel region 22, and the wall surface of select gate 14. A silicon nitride layer 24 overlies first silicon dioxide layer 22, and a second silicon dioxide layer 26 overlies silicon nitride layer 24. During programming, electrons from source region 16 traverse channel region 32, and under an electric field gradient generated in channel region 32, are injected across first silicon dioxide layer 22 and into trapping sites 34 located in silicon nitride layer 24. The trapping sites are concentrated in silicon nitride layer 24 on the source-side of control gate electrode 30.

A potential gradient is created in channel region 32 by applying positive voltage potentials to select gate 14, drain region 18, and control gate 30. For example, applying one to two volts to select gate 14 weakly turns on the first portion of channel 32 and attracts charge carriers into the first portion of channel region 13. With about 10 volts applied to control gate 30 and about 5 volts applied to drain region 18, the second portion of channel region 32, below control gate 30, is strongly turned on. The potential gradient created by the electric fields generated at the interface of the first and second portions of channel region 32 accelerates electrons traveling across channel region 32 from source region 16. The electrons achieve a sufficient acceleration energy to overcome the potential barrier at the interface of substrate 10 and first silicon dioxide layer 22, and are injected into trapping sites 34 in silicon nitride layer 24.

The programming operation described above is known in the art as source-side injection. Programming by source-side injection is carried out at a relatively low drain voltage in comparison with drain-side hot carrier injection. The low drain voltage enables EEPROM cells to be programmed by using a single 5-volt power supply. The higher voltage applied to the control gate during programming can be attained by charge pumping circuitry electrically coupled to the 5-volt power supply. Additionally, the programming efficiency is greater with source-side injection than with drain-side injection. Source-side injection rapidly increases the threshold voltage of the channel region below the trapping sites 34, effectively placing the device in a programmed or logic 0 state within a few microseconds.

The EEPROM device of the invention is erased by applying a high positive voltage to control gate 30, while grounding select gate 14, source 16, and drain region 18. Under the applied voltage potential, Fowler-Nordheim tunneling can take place, and electrons tunnel from trapping sites 34 through second silicon dioxide layer 26 and are dissipated in control gate 30. Erasing the EEPROM device by tunneling electrons through the top oxide improves the performance of the device by increasing the overall number of times in which the device can be programmed and erased without suffering dielectric breakdown.

Select gate electrode 14 is positioned between source region 16 and control gate 30. The position of select gate 14, relative to the source region and the control gate, imparts important functional characteristics to the EEPROM device of the invention. In addition to controlling the programming current during a write operation, select gate electrode 14 prevents a false "on" condition when adjacent memory cells located on the same bit line are addressed during a read operation.

FIG. 2 illustrates one embodiment of a cell array utilizing the EEPROM device of the present invention. The select gates are formed and interconnected along a row designated as SG1 and SG2. The control gates, formed as sidewall spacers on the select gate, are designated as CG1 and CG2, and are necessarily disposed in a parallel alignment with the select gates. The select gates are arranged such that an entire row of cells can be turned off when reading a bit line column such as D1, D2, D3, or D4. In addition to preventing false on readings, the select gates are fabricated to prevent false readings from the overerasing of any individual cell in the array. An overerase condition occurs when positive charge carriers accumulate in trapping sites 34 during an erase operation. After erasing, the threshold voltage in the second portion of channel region 32 has a value of about 0 volts, or even a slightly positive voltage value. The accumulation of positive carriers in nitride layer 24 can deplete the channel causing a small amount of current to flow from source region 16 to drain region 18. However, grounding select gate 14 effectively prevents any current flow in channel region 32.

A common source line S is displaced parallel to the drain lines in the array. A single source line serves several blocks of memory cells. All of the signal lines illustrated in FIG. 2 are connected to external circuitry (not shown), which supplies the operating voltages and ground signals for the cell array.

The operating voltages for the EEPROM device of the present invention, arranged in the memory array illustrated in FIG. 2, are shown in Table I.

TABLE I

|  | D | CG | SG | S |
|---|---|---|---|---|
| Program | 5 | 10 | 1 | 0 |
| Erase | 0 | 14 | 0 | 0 |
| Read | 2 | 2 | 5 | 0 |

It is important to note that all operational voltages for the EEPROM device of the present invention can be provided by a single 5-volt power supply. If a further reduction in the power supply is required, such as a 3-volt power supply, the control gate and drain voltages can be obtained from a charge pump circuit. The ability to operate the EEPROM device of the invention at relatively low voltage levels, enables this device to be easily integrated into a wide variety of integrated circuits operating with a single power supply. By removing the need to fabricate an additional power supply, considerable chip surface area is made available for the fabrication of other components, such as additional memory cells, and the like. Furthermore, by fabricating the control gate electrode as a sidewall spacer adjacent to the select gate electrode, the packing density of the individual memory cells is greatly increased.

Figure 4:
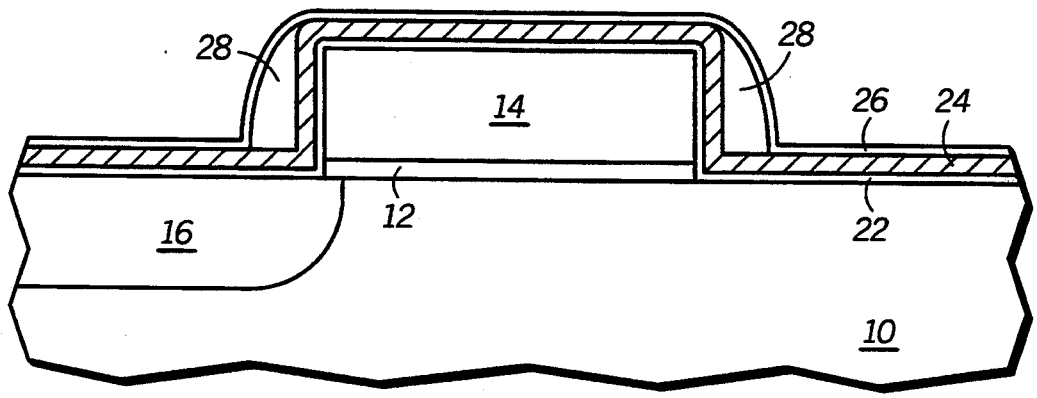
Figure 5:
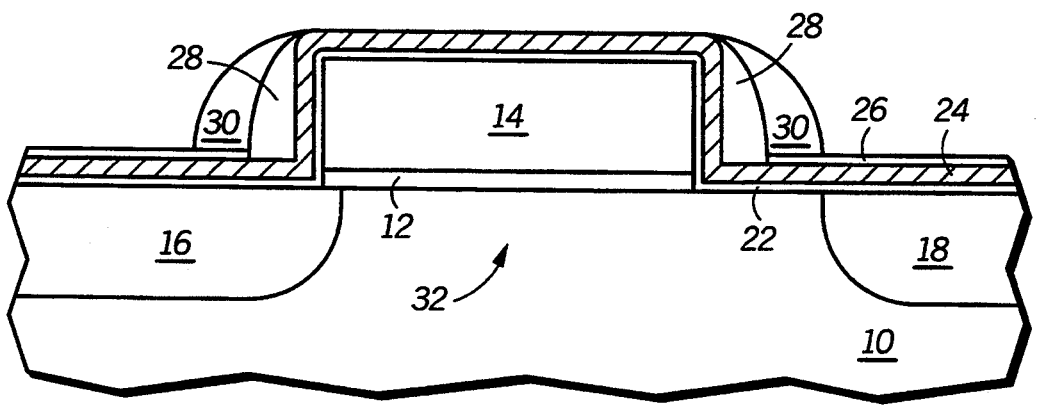

An illustrative process sequence for the fabrication of an EEPROM device in accordance with one embodiment of the invention is illustrated, in cross-section, in FIGS. 3–5. Referring to FIG. 3, a dielectric layer 12 overlies substrate 10 and separates select gate electrode 14 from substrate 10. Dielectric layer 12 is preferably a thermally grown silicon dioxide layer having a thickness of about 100 to 300 angstroms. After performing a thermal oxidation process to grow dielectric layer 12, a first polysilicon layer is deposited to overlie dielectric layer 12. Preferably, the polysilicon is deposited by chemical vapor deposition to a thickness of about 2000 to 3000 angstroms. The polysilicon layer is doped to have an n-type conductivity by introducing phosphorous or arsenic, either during deposition or in a subsequent doping step. Once deposited, the polysilicon layer is annealed to activate the dopant atoms, and a photolithographic processing and ion etching process are carried out to form select gate electrode 14. The ion etching process can be continued to remove portions of dielectric layer 12 which do not underlie select gate 14. Alternatively, exposed portions of dielectric layer 12 can be removed by wet chemical etching.

Following the formation of select gate 14, an ion implantation process is carried out to form source region 16, using select gate 14 to align the edge of source region 16 to the edge of select gate 14. The ion implant process forms a source region which is self-aligned to the edge of the select gate electrode. The implant is preferably performed through an oxide layer overlying the surface of the substrate. The oxide layer can be a portion of dielectric layer 12, a sacrificial oxide layer, or a the first silicon dioxide layer of ONO layer 20.

After defining select gate electrode 14 and dielectric layer 12, first silicon dioxide layer 22 is formed, preferably by thermal oxidation of substrate 10, and select gate electrode 14. Preferably, first silicon dioxide layer 22 is grown to a thickness of about 100 to 150 angstroms. It is important to note that because the EEPROM device of the invention is not programmed by Fowler-Nordheim tunneling, first oxide layer 22 can be grown to a relatively large thickness. The relatively large thickness enables the formation of a high quality silicon dioxide layer which is less prone to oxide defects such as pinholes and the like.

Next, a silicon nitride layer 24 is formed by chemical vapor deposition to overlie first silicon dioxide layer 22. Silicon nitride layer 24 is conformally deposited to overlie both laterally and horizontally disposed surfaces on substrate 10. Preferably, silicon nitride layer 24 is deposited to a thickness of about 50 to 100 angstroms. After depositing silicon nitride layer 24, it is possible to form an insulating sidewall spacer 28 on the vertically disposed portions of silicon nitride layer 24. Insulating sidewall spacer 28 can be used to prevent voltage breakdown between select gate 14 and control gate 30 during cell erase operations. Insulating sidewall spacer 28 can be formed by depositing a layer of silicon dioxide, such as by chemical vapor deposition using tetraethylorthosilane source gas (TEOS). Then, performing an anisotropic etch using a reactive ion etching apparatus. In the absence of insulating sidewall spacer 28, a positive voltage of about 5 to 7 volts can be applied to select gate 14 during erase operations to reduce the voltage potential across the silicon nitride layer.

ONO layer 20 is completed by forming second silicon dioxide layer 26 overlying silicon nitride layer 24. Preferably, second silicon dioxide layer 26 is formed by chemical vapor deposition using TEOS source gas. Second silicon dioxide layer 26 is deposited to have a relative thickness somewhat less than the thickness of first silicon dioxide layer 22. This is important because Fowler-Nordheim tunneling is used to erase the EEPROM device by tunneling electrons from trapping sites 34 through second silicon dioxide layer 26. Preferably, second silicon dioxide layer 26 is deposited to a thickness of about 30 to 40 angstroms.

It is important to note that the tunnel erasing mechanism in the present invention is carried out through a deposited silicon dioxide layer. The chemical vapor deposition process provides a thin silicon dioxide layer of uniform thickness and relatively few defects. The tunneling efficiency is high because electrons are not trapped in defects in the silicon dioxide layer, and because high field regions are not created by thickness nonuniformity. In comparison with the prior art, an silicon oxide layer thermally grown on a polysilicon floating gate electrode suffers from poor thickness uniformity and defects arising from the grain structure of polysilicon. The present invention achieves higher erasing efficiency by providing a high quality deposited silicon dioxide layer overlying charge storing silicon nitride layer.

The functional elements of the EEPROM device of the present invention are completed with the fabrication of control gate 30 as illustrated in FIG. 5. Preferably, control gate 30 is formed by depositing a second layer of polysilicon by chemical vapor deposition to a thickness of about 2000 to 3000 angstroms. In a similar manner to that of the fabrication of select gate electrode 14, the second polysilicon layer is doped with phosphorous or arsenic either during the chemical vapor deposition process, or by a separate thermal doping step.

Following deposition, the second polysilicon layer is anisotropically etched in a reactive ion etching apparatus to form a sidewall spacer overlying the vertically disposed surfaces of ONO layer 22 and select gate 14. As previously described, the portion of control gate 30 overlying source region 16 can be removed by a subsequent etching step. In this case, a photolithographic mask is defined to overlie substrate 10 and expose only those portions of control gate 30 that are to be removed. Then, an etching step can be carried out to remove the exposed portion of control gate 30. The etching step can be performed by either dry etching, or by wet chemical etching.

Once control gate 30 is formed, an ion implantation process is carried out to form drain region 18. The ion implantation process is performed in such a way as to align the edge of drain region 18 to the edge of control gate 30 as illustrated in FIG. 5. In this case, control gate 30 can be used as a doping mask, or alternatively a photolithographic mask can be defined to expose only a selected portion of substrate 10.

Although, only a portion of the EEPROM device is shown in cross-section in FIGS. 3-5, as schematically illustrated in FIG. 2, the select gate electrode is defined as a strip of polysilicon which traverses several memory cells. Correspondingly, the control gate electrode is a continuous side-wall spacer disposed along the edge of the select gate electrode.

The fabrication process provides a select gate electrode which is aligned to source region 16 and overlies a first portion of channel region 32. Additionally, a control gate electrode is formed, which is aligned to drain region 18 and overlies a second portion of channel region 32. During the anisotropic etching process used to form control gate 30, the layers of insulating material overlying select gate 14 are not appreciably etched. This is a result of the etching selectivity of the anisotropic etching process. In a preferred method, chlorine based etchant chemistry is used to remove polysilicon at a relatively higher etch rate than insulating materials such as silicon dioxide and silicon nitride. As a result of the selective anisotropic etching process, upon completion of the etch to form control gate 30 all insulating layers present on the surface of substrate 10 remain substantially unetched.

Figure 6:
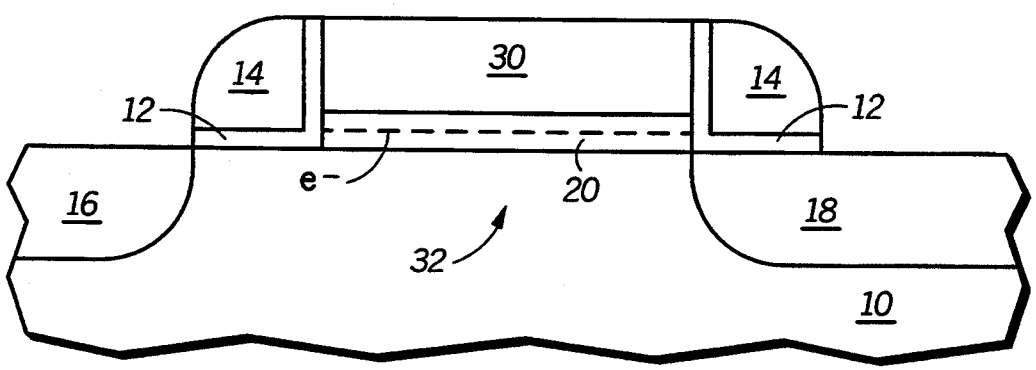
FIG. 6 illustrates, in cross-section, an EEPROM device arranged in accordance with an alternative embodiment of the invention.

An alternative embodiment of the EEPROM device of the invention is illustrated, in cross-section, in FIG. 6. In the alternative embodiment, a reverse process from that described in the previous embodiment is used, such that the select gate electrode is formed as a sidewall spacer on the control gate electrode. In this embodiment, a first polysilicon layer is photolithographically patterned to define a control gate electrode overlying the second portion of channel region 32. Once the control gate is formed, an ion implantation process is carried out to form drain region 18, which is aligned to the edge of control gate 30, as illustrated in FIG. 6. Following the deposition and anisotropic etching of a second polysilicon layer to form select gate electrode 14, a second ion implantation process is carried out to align source region 16 to the edge of select gate electrode 14.

A process for fabricating the invention according to the alternative embodiment begins with the deposition of ONO layer 20 onto substrate 10, followed by the deposition of a first polysilicon layer. Both the first polysilicon layer and the ONO layer are anisotropically etched to align ONO layer 20 to control gate 30. Once control gate 30 is defined, dielectric layer 12 is deposited preferably by a chemical vapor deposition process using TEOS source gas.

The EEPROM device fabricated in accordance to the alternative embodiment, operates in a manner identical to the EEPROM device in accordance with the previous embodiment. During programming, electrons travel across the first portion of channel region 32 under the weak electric field created by applying a small positive voltage to select gate 14, and are accelerated by the potential difference as they encounter the stronger electric field created by applying a much higher voltage to control gate 30. The accelerated electrons are injected into trapping sites located in ONO layer 20 near the source-side of control gate 30. The EEPROM device illustrated in FIG. 6 is erased by applying a high voltage to control gate 14, while grounding drain region 18, source region 16, and select gate 14. As in the previous embodiment, the electrons tunnel through the top oxide layer of ONO layer 20 and are dissipated in control gate 30.

A cell array constructed in accordance with the alternative embodiment is substantially the same as that shown in FIG. 2. In comparison with a cell array of the previous embodiment, in a cell array arranged in accordance with the alternative embodiment, only the relative position of the control gate and select gate overlying channel region 32 are reversed.

Thus it is apparent that there has been provided, in accordance with the invention, an EEPROM device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other materials can be used for the formation of the gate electrodes, such as a refractory-metal silicide in combination with polysilicon. Further, additional substrate doping steps can be carried out to form drain extensions, and graded junctions, and the like. It is therefore intended to include within the invention all such variations and modifications as fall within the scope of the appended claims and equivalents thereof.

I claim:

1. A split-gate EEPROM device comprising:
   a semiconductor substrate having a source region and a drain region therein and spaced apart by a channel region;
   a select gate overlying a first portion of the channel region and separated therefrom by a dielectric layer;
   a control gate overlying a second portion of the channel region and spaced apart from the source region by the select gate,
   wherein the control gate and the select gate are disposed on the semiconductor substrate in parallel relationship,
   wherein a first edge of the select gate is in spaced relation with an interface between the source region and the .channel region, and
   wherein a first edge of the control gate is in spaced relation with an interface between the drain region and the channel region; and
   an ONO layer separating the control gate from the channel region,
   wherein the ONO layer includes a relatively thick silicon oxide layer overlying the substrate and separated from a relatively thin silicon oxide layer by a silicon nitride layer.

2. The device of claim 1, further comprising electron trapping sites in the silicon nitride layer in proximity to the source end of the control gate electrode, such that electrons from the source region can be retained in the trapping sites.

3. The device of claim 1, wherein the relatively thick silicon oxide layer has a thickness of 100 to 150 angstroms, and the relatively thin silicon oxide layer has a thickness of 30 to 40 angstroms.

4. The device of claim 1, further comprising a silicon oxide layer overlying the ONO layer in a region intermediate to the control gate and the select gate.

5. The device of claim 1, wherein the control gate is formed as a sidewall spacer adjacent to the select gate.

6. The device of claim 1, wherein the select gate is formed as a sidewall spacer adjacent to the control gate.

7. A split-gate EEPROM device comprising:
   a semiconductor substrate having a source region and a drain region therein and spaced apart by a channel region;
   a portion of a first polysilicon layer overlying a first portion of the channel region and separated therefrom by a dielectric layer; and
   a portion of a second polysilicon layer formed as a sidewall spacer and overlying an edge portion of the first polysilicon layer and a second portion of the channel region,
   wherein the second polysilicon layer is separated from the first polysilicon layer and the channel region by an ONO layer,
   wherein an edge portion of the second polysilicon layer is in spaced relation with an interface between the drain region and the channel region,
   wherein an edge portion of the first polysilicon layer is in spaced relation with an interface between the source region and the channel region, and
   wherein the ONO layer contains charge trapping sites in proximity to the source region for retaining electrons injected into the ONO layer from the source region.

8. The device of claim 7, wherein the second polysilicon layer under a predetermined applied voltage exerts an electric field in the ONO layer, such that electrons are injected into the trapping sites during a programming operation, and electrons tunnel into the second polysilicon layer during an erase operation.

9. The device of claim 8, wherein the first polysilicon layer under a predetermined applied voltage prevents the formation of a depletion region in the channel region during an erase operation.

10. The device of claim 7, wherein an edge portion of the first polysilicon layer is in spaced relation with an interface between the drain region and the channel region, and wherein the first polysilicon layer under a predetermined applied voltage exerts an electric field in the ONO layer, such that electrons are injected into the trapping sites during a programming operation and electrons tunnel into the first polysilicon layer during an erase operation.

11. The device of claim 10, wherein an edge portion of the second polysilicon layer is in spaced relation with an interface between the source region and the channel region, and wherein the second polysilicon layer under a predetermined applied voltage prevents the formation of a depletion region in the channel region during an erase operation.

12. The device of claim 7, wherein the ONO layer comprises:
   a first silicon oxide layer having a first thickness;
   a silicon nitride layer overlying the first silicon oxide layer; and
   a second silicon oxide layer overlying the silicon nitride layer and having a second thickness,
   wherein the first thickness is greater than the second thickness.

13. A split-gate EEPROM device comprising:
   a semiconductor substrate having a source region and a drain region therein and spaced apart by a channel region;
   a select gate overlying h first portion of the channel region and separated therefrom by a dielectric layer;
   a control gate overlying a second portion of the channel region,
   wherein the control gate is spaced apart from the source region by the select gate,
   wherein a first edge of the select gate is in spaced relation with an interface between the source region and the channel region, and
   wherein a first edge of the control gate is in spaced relation with an interface between the drain region and the channel region;
   an ONO layer separating the control gate from the channel region,
   wherein the ONO layer includes a relatively thick silicon oxide layer overlying the substrate and separated from a relatively thin silicon oxide layer by a silicon nitride layer, and wherein electron trapping sites reside in the silicon nitride layer in proximity to the source side of the control gate;

means for grounding the source region and applying a positive voltage to the drain and select gate during a write operation, such that electrons are retained in the trapping sites; and means for grounding the source, drain, and select gate, and applying a positive voltage to the control gate during an erase operation, such that electrons tunnel through the relatively thin silicon oxide layer.

* * * * *